(12) United States Patent
Hasumi et al.

(10) Patent No.: US 7,755,407 B2
(45) Date of Patent: Jul. 13, 2010

(54) VARIABLE DELAY CIRCUIT, TESTING APPARATUS, AND ELECTRONIC DEVICE

(75) Inventors: Takuya Hasumi, Tokyo (JP); Masakatsu Suda, Tokyo (JP); Satoshi Sudou, Tokyo (JP)

(73) Assignee: Advantest Corporation, Tokyo (JP)

( * ) Notice: Subject to any disclaimer, the term of this patent is extended or adjusted under 35 U.S.C. 154(b) by 24 days.

(21) Appl. No.: 12/233,616

(22) Filed: Sep. 19, 2008

(65) Prior Publication Data
US 2009/0039939 A1 Feb. 12, 2009

Related U.S. Application Data

(63) Continuation of application No. PCT/JP2007/057240, filed on Mar. 30, 2007.

(30) Foreign Application Priority Data
Mar. 31, 2006 (JP) .............................. 2006-099359

(51) Int. Cl.
*H03H 11/26* (2006.01)

(52) U.S. Cl. ...................... 327/270; 327/276; 327/278; 327/281

(58) Field of Classification Search ...................... None
See application file for complete search history.

(56) References Cited

U.S. PATENT DOCUMENTS

| | | | | |
|---|---|---|---|---|
| 5,349,311 A | | 9/1994 | Mentzer | |
| 5,477,182 A | * | 12/1995 | Huizer | 327/261 |
| 6,894,548 B2 | * | 5/2005 | Hochschild et al. | 327/175 |
| 7,102,407 B2 | * | 9/2006 | Slawecki | 327/263 |
| 7,332,943 B2 | * | 2/2008 | Botti et al. | 327/112 |
| 2007/0046354 A1 | * | 3/2007 | Kuroki et al. | 327/261 |
| 2009/0201072 A1 | * | 8/2009 | Honea et al. | 327/424 |

FOREIGN PATENT DOCUMENTS

| | | |
|---|---|---|
| JP | 61-39722 | 2/1986 |
| JP | 04-13305 | 1/1992 |
| WO | 2005-060098 | 6/2005 |

* cited by examiner

*Primary Examiner*—Tuan Lam
*Assistant Examiner*—Hiep Nguyen
(74) *Attorney, Agent, or Firm*—Osha • Liang LLP

(57) ABSTRACT

Provided is a variable delay circuit outputting an output signal delayed with respect to an input signal by a designated delay time, including: a delay controller outputting a control voltage according to the delay time; a MOS transistor receiving the control voltage at a gate, and outputs a drain current according to the control voltage; a correction section connected in parallel to a source and a drain of the current controlling MOS transistor, and outputs a correction current on a monotonic decrease as the drain current increases in a range larger than a predetermined boundary current within a normal usage range of the drain current; and a delay element running an output current resulting from adding the correction current to the drain current, between the delay element and an output terminal of the variable delay circuit, in changing a signal value of the output signal according to the input signal.

10 Claims, 13 Drawing Sheets

VARIABLE DELAY CIRCUIT, TESTING APPARATUS, AND ELECTRONIC DEVICE

CROSS REFERENCE TO RELATED APPLICATION

This is a continuation application of PCT/JP2007/057240 filed on Mar. 30, 2007 which claims priority from a Japanese Patent Application No. 2006-099359 filed on Mar. 31, 2006, the contents of which are incorporated herein by reference.

BACKGROUND

1. Technical Field

The present invention relates to a variable delay circuit, a test apparatus, and an electronic device. In particular, the present invention relates to a variable delay circuit that outputs an output signal delayed with respect to an input signal by a designated time period, and to a test apparatus and an electronic device equipped with such a variable delay circuit.

2. Related Art

A conventional test apparatus includes a variable delay circuit that outputs a timing signal delayed with respect to a reference clock by a designated time period. For example, WO 2005/060098 discloses a variable delay circuit that changes the delay time by controlling the power supply current of the delay element by a MOS transistor for example.

It is desirable that the variable delay circuit disclosed in WO 2005/060098 causes the MOS transistor in a saturated region to control the power supply current of the delay element. Accordingly, the variable delay circuit is able to cause the MOS transistor to operate as a power current supply, to improve the linearity of the delay time.

In recent years, however, the power supply voltage of a CMOS circuit has decreased, making it difficult to realize a large Vds for a MOS transistor of a variable delay circuit. In addition, if the Vgs of the MOS transistor cannot be made large, the variable delay circuit cannot run a large power current to the delay element. When using a small Vds to run a large power current to the delay element, the variable delay circuit cannot easily operate the MOS transistor in a saturated region, which degrades the linearity of the delay time.

SUMMARY

Therefore, it is an object of an aspect of the innovations herein to provide a variable delay circuit, a test apparatus, and an electronic device, which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary variable delay circuit that outputs an output signal delayed with respect to an input signal by a designated delay time, includes: a delay controller that outputs a control voltage according to a set value of the delay time; a power current controlling MOS transistor that receives the control voltage at a gate thereof, and outputs a drain power current according to the control voltage; a correction section that is connected in parallel to a source and a drain of the power current controlling MOS transistor, and outputs a correction power current on a monotonic decrease as the drain power current increases in a range larger than a predetermined boundary power current within a normal usage range of the drain power current; and a delay element that runs an output power current resulting from adding the correction power current to the drain power current, between the delay element and an output terminal of the variable delay circuit, thereby outputting the output signal delayed by a time according to the output power current, in changing a signal value of the output signal according to the input signal.

According to the second aspect related to the innovations herein, one exemplary test apparatus for testing an electronic device, includes: a pattern generator that generates a test pattern for testing the electronic device; a waveform shaper that shapes the test pattern and supplies the shaped test pattern to the electronic device; and a timing generator that outputs a timing signal for controlling a timing at which the waveform shaper supplies the test pattern to the electronic device, where the timing generator includes: a delay controller that outputs a control voltage according to a designated value of a delay time designated by the test pattern to delay a reference clock; a power current controlling MOS transistor that receives the control voltage at a gate thereof, and outputs a drain power current according to the control voltage; a correction section that is connected in parallel to a source and a drain of the power current controlling MOS transistor and outputs a correction power current, the correction power current increasing monotonically as the drain power current increases in a range smaller than a predetermined boundary power current within a normal usage range of the drain power current, and decreasing monotonically as the drain power current increases in a range larger than the boundary power current; and a delay element that runs, between the delay element and an output terminal of the timing generator, an output power current resulting from adding the correction power current to the drain power current, thereby outputting the timing signal delayed with respect to the reference clock by a time according to the output power current, in changing a signal value of an output signal according to an input signal.

According to the third aspect related to the innovations herein, one exemplary electronic device includes: a circuit under test; and a test circuit for testing the circuit under test, where the test circuit includes: a pattern generator that generates a test pattern for testing the circuit under test; a waveform shaper that shapes the test pattern and supplies the shaped test pattern to the circuit under test; and a timing generator that outputs a timing signal for controlling a timing at which the waveform shaper supplies the test pattern to the circuit under test, and where the timing generator includes: a delay controller that outputs a control voltage according to a designated value of a delay time designated by the test pattern to delay a reference clock; a power current controlling MOS transistor that receives the control voltage at a gate thereof, and outputs a drain power current according to the control voltage; a correction section that is connected in parallel to a source and a drain of the power current controlling MOS transistor and outputs a correction power current, the correction power current increasing monotonically as the drain power current increases in a range smaller than a predetermined boundary power current within a normal usage range of the drain power current and decreasing monotonically as the drain power current increases in a range larger than the boundary power current; and a delay element that runs, between the delay element and an output terminal of the timing generator, an output power current resulting from adding the correction power current to the drain power current, thereby outputting the timing signal delayed with respect to the reference clock by a time according to the output power current, in changing a signal value of an output signal according to an input signal.

According to the fourth aspect related to the innovations herein, one exemplary variable delay circuit for outputting an output signal delayed with respect to an input signal by a designated delay time, includes: a delay controller that outputs a control signal according to a set value of the delay time; a power current controller that is coupled with an output terminal of the delay controller, receives a control signal outputted from the delay controller, and outputs a driving power current based on the control signal; and a delay element that includes a signal input terminal for receiving the input signal, a power supply input terminal for receiving and outputting the power current, and a signal output terminal for outputting an output signal delayed by a time according to the driving power current.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
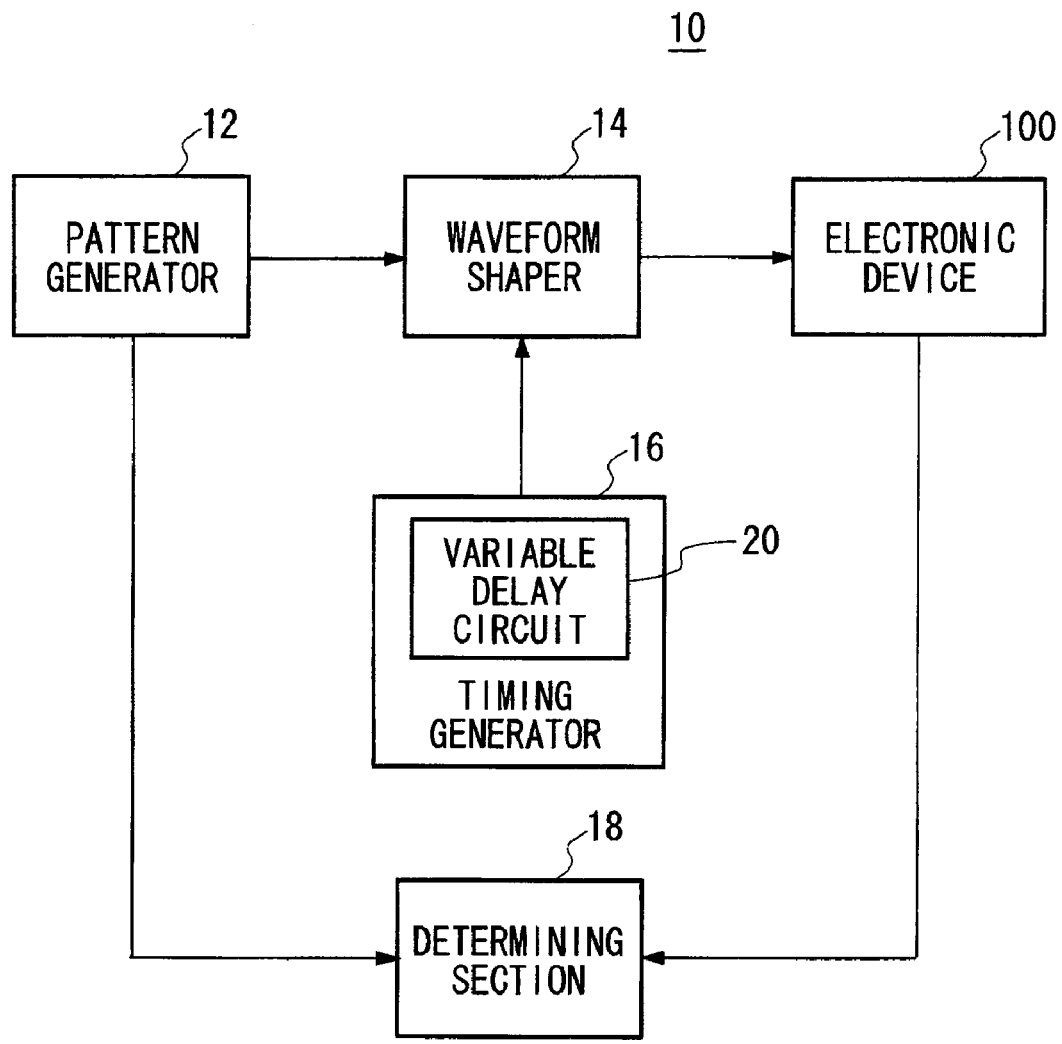
FIG. 1 shows a configuration of a test apparatus 10 according to an embodiment of the present invention, together with an electronic device 100.

FIG. 1 shows a configuration of a test apparatus 10 according to an embodiment of the present invention, together with an electronic device 100. The test apparatus 10 tests an electronic device 100 such as a semiconductor device for example. The test apparatus 10 includes a pattern generator 12, a waveform shaper 14, a timing generator 16, and a determining section 18.

The pattern generator 12 generates a test pattern for testing the electronic device 100, and supplies the generated test pattern to the waveform shaper 14. The waveform shaper 14 shapes the received test pattern, and supplies the test pattern to the electronic device 100 according to a timing given by the timing generator 16. The timing generator 16 outputs a timing signal for controlling the timing at which the waveform shaper 14 supplies the test pattern to the electronic device 100. The timing generator 16 includes a variable delay circuit 20, and generates a timing signal by delaying the reference clock by means of the variable delay circuit 20 by a designated delay time. The determining section 18 determines whether the electronic device 100 is defective or not by comparing the output signal outputted from the electronic device 100 according to the test signal, with an expected value signal supplied from the pattern generator 12.

Figure 2:
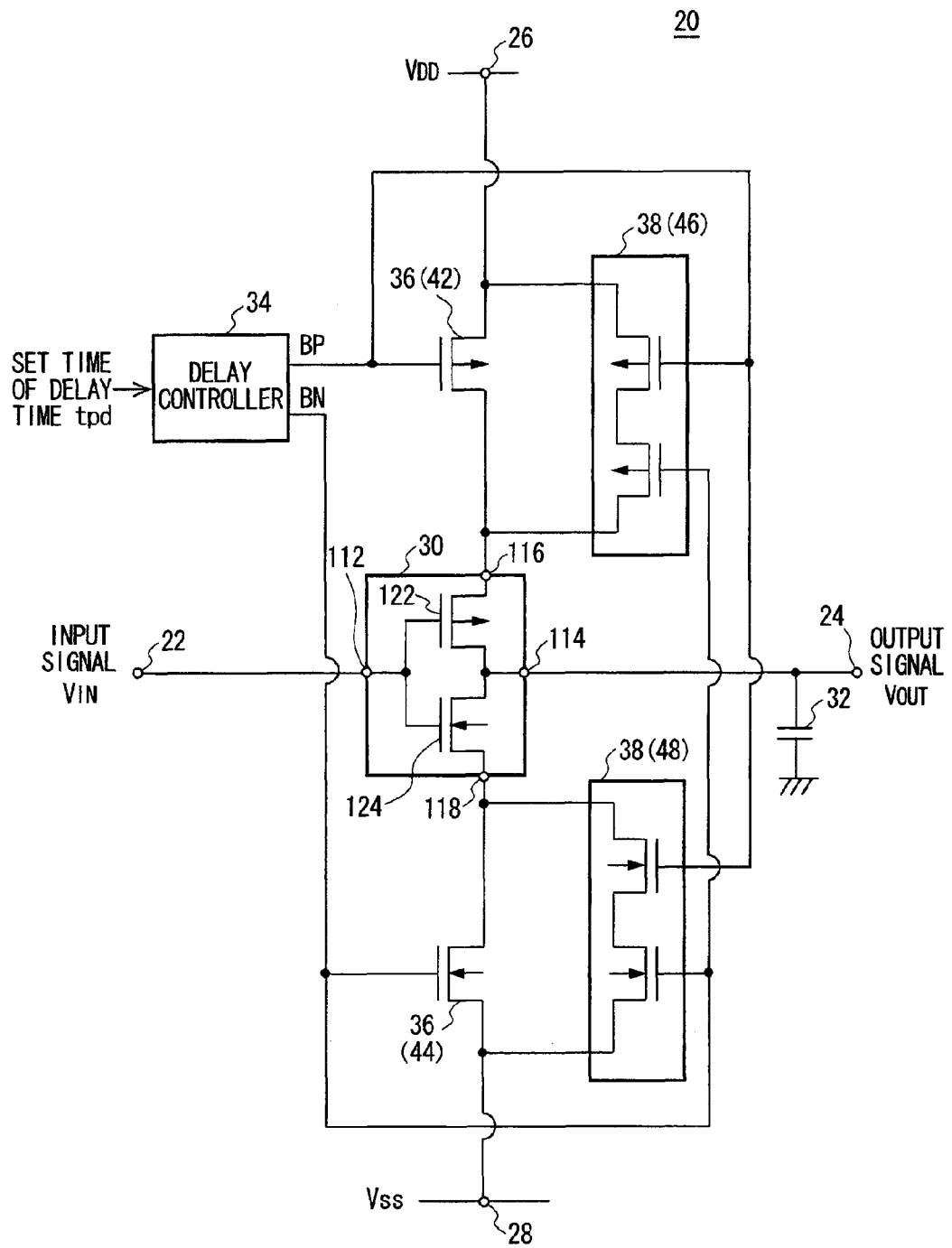
FIG. 2 shows an exemplary configuration of a variable delay circuit 20 according to an embodiment of the present invention.

FIG. 2 shows an exemplary configuration of a variable delay circuit 20 according to an embodiment of the present invention. The variable delay circuit 20 receives an input signal $V_{IN}$ via an input terminal 22, and outputs an output signal $V_{OUT}$ via an output terminal 24, where the output signal $V_{OUT}$ results from delaying the input signal $V_{IN}$ by a designated delay time tpd. The variable delay circuit 20 receives a reference clock as an input signal, and outputs an output signal as a timing signal, for example. In addition, the variable delay circuit 20 receives a positive power supply voltage $V_{DD}$ via a positive power supply terminal 26, and receives a negative power supply voltage $V_{SS}$ via a negative power supply terminal 28.

The variable delay circuit 20 includes a delay element 30, a capacitor 32, a delay controller 34, a power current controlling MOS transistor 36, and a correction section 38. The delay element 30 receives an input signal $V_{IN}$ received by the variable delay circuit 20, via the delay element input terminal 112, and outputs an output signal $V_{OUT}$ that changes according to the input signal, via the delay element output terminal 114.

The delay element 30 may include a delay pMOS transistor 122 and a delay nMOS transistor 124, and be an inverting circuit that outputs an output signal $V_{OUT}$ resulting from inverting the logic level of the input signal $V_{IN}$, for example. The delay pMOS transistor 122 is such that the gate thereof is connected to the delay element input terminal 112, the source thereof is connected to the positive power supply input terminal 116 that receives a positive driving power current from the positive power supply voltage $V_{DD}$, and the drain thereof is connected to the delay element output terminal 114. The delay nMOS transistor 124 is such that the gate thereof is connected to the delay element input terminal 112, the source thereof is connected to the negative power supply input terminal 118 that receives a negative driving power current from the negative power supply voltage $V_{SS}$, and the drain thereof is connected to the delay element output terminal 114.

When the input signal $V_{IN}$ has an H logic level, a delay element 30 brings the delay pMOS transistor 122 to be OFF, and the delay nMOS transistor 124 to be ON. Therefore, in this case, the delay element 30 outputs the output signal $V_{OUT}$ of an L logic level via the delay element output terminal 114, as well as outputting an output power current drawn from the delay element output terminal 114, towards the negative power supply voltage $V_{SS}$ via the negative power supply input terminal 118. When the input signal $V_{IN}$ has a an L logic level, the delay element 30 brings the delay pMOS transistor 122 to be ON and the delay nMOS transistor 124 to be OFF. Therefore, in this case, the delay element 30 outputs the output signal $V_{OUT}$ of an H logic level via the delay element output terminal 114, as well as outputting, via the delay element output terminal 114, the output power current received from the positive power supply voltage $V_{DD}$ via the negative power supply input terminal 118.

The capacitor 32 is provided between the output terminal 24 and a reference potential (e.g., ground). Note that a load having a capacitance component is connected to the output terminal 24, and when the capacitance component functions as the capacitor 32, the variable delay circuit 20 does not have to include the capacitor 32.

The delay controller 34 outputs a control voltage according to a set value of the delay time tpd. The delay controller 34 may output a positive control voltage BP that becomes higher when the set value of the delay time tpd is larger, and output a negative control voltage BN that becomes lower when the set value of the delay time tpd is larger.

The power current controlling MOS transistor 36 receives a control voltage outputted from the delay controller 34 at the gate thereof, and outputs a drain power current according to the control voltage. That is, the power current controlling MOS transistor 36 outputs a drain power current according to the designated set value of the delay time tpd. One example of the power current controlling MOS transistor 36 may be a power current controlling pMOS transistor 42 and a power current controlling nMOS transistor 44. The power current controlling pMOS transistor 42 may receive a positive control voltage BP at the gate thereof, output a positive drain power current according to the positive control voltage BP, and supply the positive drain power current to the delay element 30 as a positive driving power current. To be more specific, the power current controlling pMOS transistor 42 may be such that the source thereof is connected to the positive power supply terminal 26, and the drain thereof is connected to the positive power supply input terminal 116 of the delay element 30. In addition, the power current controlling nMOS transistor 44 may receive a negative control voltage BN at the gate thereof, output a negative drain power current according to the negative control voltage BN, and supply the negative drain power current to the delay element 30 as a negative driving power current. To be more specific, the power current controlling nMOS transistor 44 may be such that the source thereof is connected to the negative power supply terminal 28, and the drain thereof is connected to the negative power supply input terminal 118 of the delay element 30.

The correction section 38 is connected in parallel to the source and the drain of the power current controlling MOS transistor 36, and outputs a correction power current on a monotonic decrease as the drain power current increases within a range larger than a predetermined boundary power current, within a normal usage range of the drain power current of the power current controlling MOS transistor 36. In addition, the correction section 38 may be on a monotonic increase as the drain power current increases within a range smaller than a predetermined boundary power current. The correction section 38 outputs a correction power current via the same path as the path on which the drain power current is outputted from the power current controlling MOS transistor 36. Accordingly, the correction section 38 can apply a correction power current to the drain power current outputted from the power current controlling MOS transistor 36.

The correction section 38 may be a positive correction section 46 and a negative correction section 48, for example. The positive correction section 46 is connected in parallel to the source and the drain of the power current controlling pMOS transistor 42, and outputs a positive correction power current on a monotonic increase as the positive drain power current increases within a range smaller than the boundary power current, and on a monotonic decrease as the drain power current increases within a range larger than the boundary power current, within a normal usage range of the positive drain power current outputted by the power current controlling pMOS transistor 42. The positive correction section 46 may supply the positive correction power current to the delay element 30 as the positive driving power current, together with the positive drain power current outputted from the power current controlling pMOS transistor 42, for example. The negative correction section 48 is connected in parallel to the source and the drain of the power current controlling nMOS transistor 44, and outputs negative correction power current on a monotonic increase as the negative drain power current increases within a range smaller than the boundary power current, and on a monotonic decrease as the drain power current increases within a range larger than the boundary power current, within a normal usage range of the negative drain power current of the power current controlling nMOS transistor 44. The negative correction section 48 may supply the negative correction power current to the delay element 30 as the negative driving power current, together with the negative drain power current outputted from the power current controlling nMOS transistor 44, for example.

The variable delay circuit 20 having this configuration outputs the output signal $V_{OUT}$ outputted from the delay element 30, to outside via the output terminal 24. Here, in changing the signal value of the output signal $V_{OUT}$ according to the input signal $V_{IN}$, the delay element 30 outputs the output signal $V_{OUT}$ delayed by a time according to the output power current, by running, between the delay element 30 and the output terminal 24 of the variable delay circuit 20, an output power current resulting from adding the correction power current outputted from the correction section 38 to the drain power current outputted from the power current controlling MOS transistor 36. That is, the delay element 30 delays the output signal $V_{OUT}$ either by delaying the response of the output signal $V_{OUT}$ by supplying a output power current to the capacitor 32 provided between the output terminal 24 and the reference potential, or by drawing out the output power current from the capacitor 32. Furthermore, the delay element 30 delays the output signal $V_{OUT}$ by a delay time determined according to the power current amount supplied to the capacitor 32, or according to the power current amount drawn out of the capacitor 32. That is, the delay element 30 outputs an output signal $V_{OUT}$, the delay time of which is small when the output power current is large, and the delay time of which is large when the output power current is small.

In causing the signal value of the output signal $V_{OUT}$ to rise according to the input signal $V_{IN}$, for example, the delay element 30 may output the output signal $V_{OUT}$ the rising edge of which is delayed by a time according to the positive output power current, by outputting the positive output power current resulting from adding a correction power current outputted from the positive correction section 46 to the positive drain power current outputted from the power current controlling pMOS transistor 42, from the output terminal 24 of the variable delay circuit 20. In causing the signal value of the output signal $V_{OUT}$ to fall according to the input signal $V_{IN}$, for example, the delay element 30 may output an output signal $V_{OUT}$ the falling edge of which is delayed by a time according to the negative output power current, by running, in the output terminal 24 of the variable delay circuit 20, a negative output power current resulting from adding a correction power current outputted from the negative correction section 48 to the negative drain power current outputted from the power current controlling nMOS transistor 44.

The variable delay circuit 20 having this configuration is able to control the delay time of the response of the output signal $V_{OUT}$ from the input signal $V_{IN}$. In this way, the variable delay circuit 20, when provided for a test apparatus 10, can generate a timing signal delayed with respect to a reference clock by a predetermined time. Further, the variable delay circuit 20 outputs an output power current resulting from adding a correction power current outputted from the correction section 38, to the drain power current outputted from the power current controlling MOS transistor 36. In this way, the variable delay circuit 20 is able to improve the linearity of the delay time tpd of the output signal from the set value of the delay time.

Figure 3:
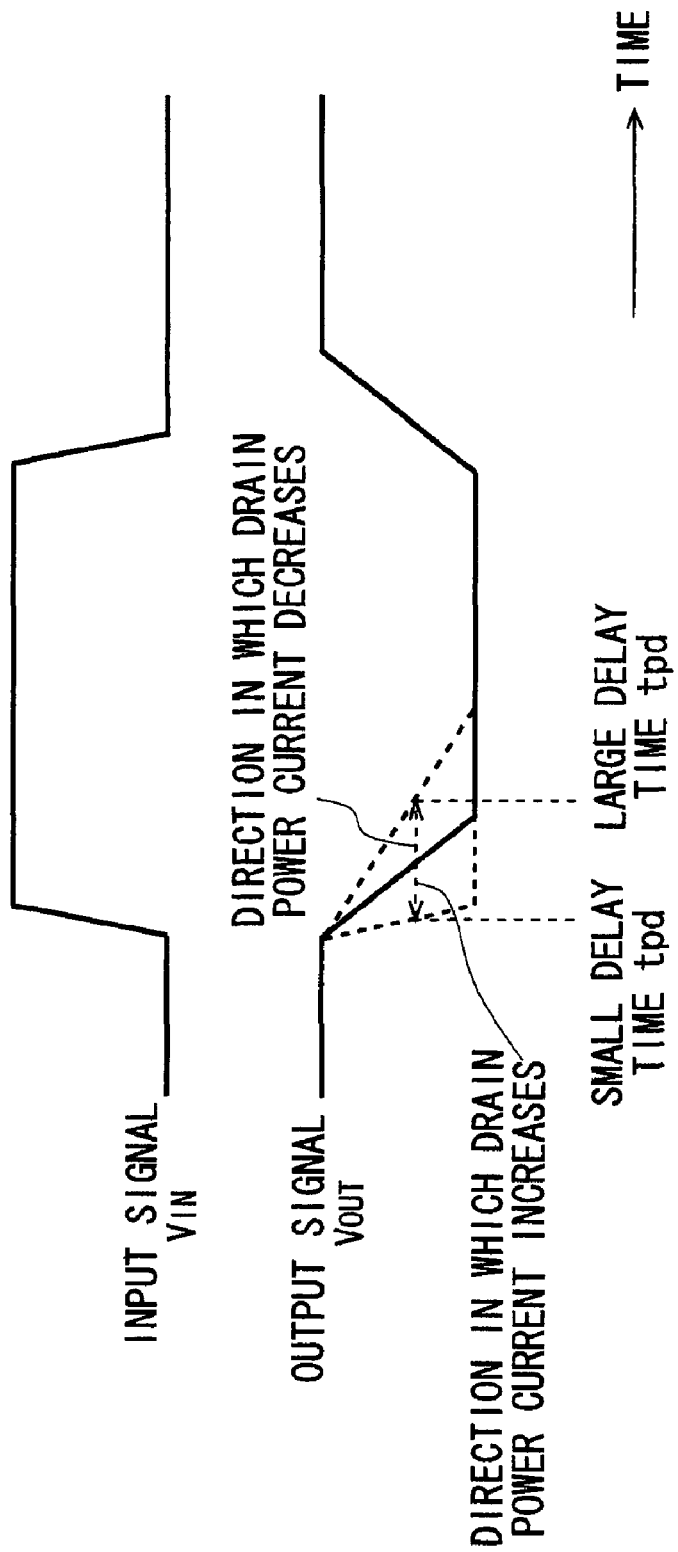
FIG. 3 shows an example of an input signal $V_{IN}$ inputted by the variable delay circuit 20 and an output signal $V_{OUT}$ outputted from the variable delay circuit 20.

FIG. 3 shows an example of an input signal $V_{IN}$ inputted to the variable delay circuit 20 and an output signal $V_{OUT}$ outputted from the variable delay circuit 20. The delay controller 34 controls the drain power current of the power current controlling MOS transistor 36, by generating a control voltage according to the set value of the delay time. The delay element 30 delays the output signal $V_{OUT}$ by a time according to the power current amount of the output power current resulting from adding a correction power current to the drain power current. Accordingly, the delay controller 34 is able to control the size of the delay time tpd of the output signal $V_{OUT}$ according to the set time of the delay time. To be more specific, the delay controller 34 decreases the delay time of the output signal $V_{OUT}$ by controlling the control voltage towards the direction in which a large amount of a drain power current runs, and increases the delay time of the output signal $V_{OUT}$ by controlling the control voltage towards the direction in which a small amount of a drain power current runs. Further, in the present embodiment, the delay controller 34 generates a delay by controlling the falling time and the rising time. In the delay element 30, the falling time and the rising time will be longer when there is a smaller amount of drain power current. In particular, in the case of a high-speed pulse, the settling will stop when there is a small amount of drain power current. Accordingly, it is desirable that the delay controller 34 controls the drain power current with a larger power current amount as a reference, i.e., performs control to run a larger amount of drain power current, to operate the delay element 30 at a high speed.

Figure 4A:
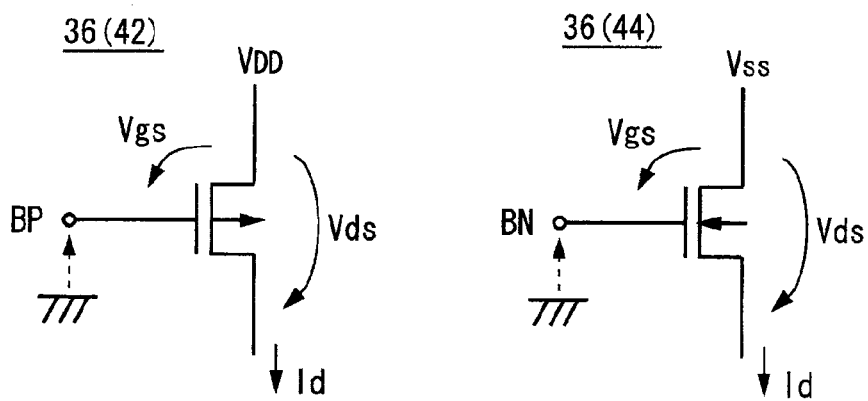
FIG. 4A shows an input voltage (control voltage BP, BN) and an output power current (drain power current Id) of a power current controlling MOS transistor 36.
Figure 4B:
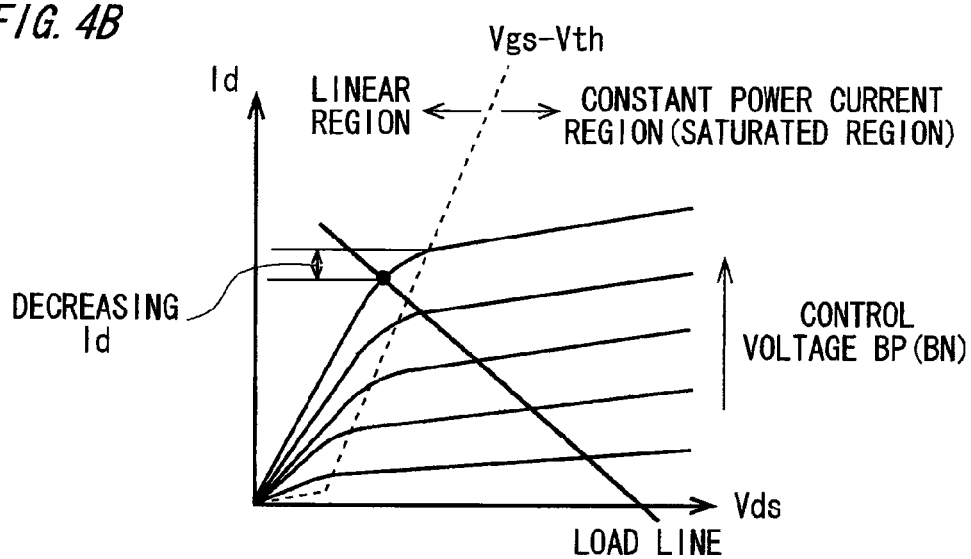
FIG. 4B shows an example of a characteristic of a voltage Vds between the source and the drain vs. the drain power current Id of the power current controlling MOS transistor 36 and a load line representing a line approximating the characteristic of the delay element 30.
Figure 4C:
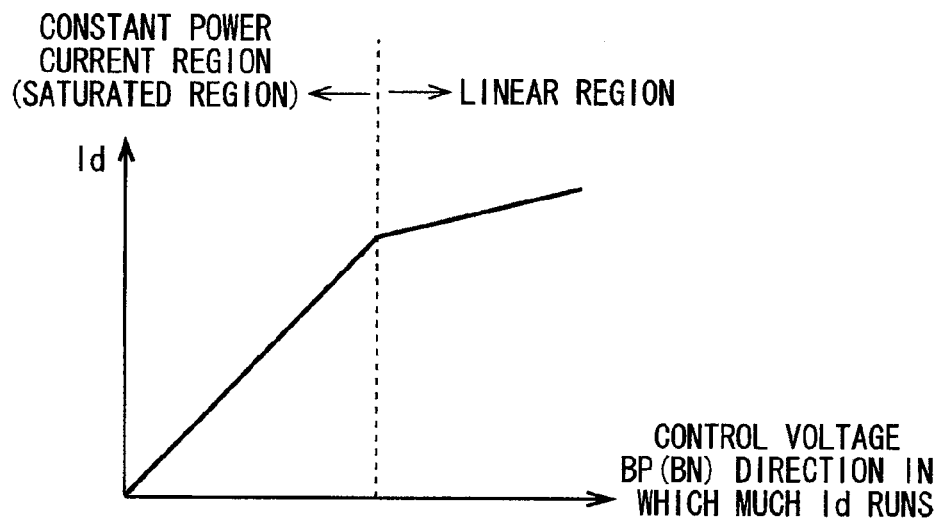
FIG. 4C shows an exemplary characteristic of the control voltage (BP, BN) vs. the drain power current Id of the power current controlling MOS transistor 36.

FIG. 4A shows an input voltage (control voltage BP, BN) and an output power current (drain power current Id) of a power current controlling MOS transistor 36. FIG. 4B shows an example of a characteristic of a voltage Vds between the source and the drain vs. the drain power current Id of the power current controlling MOS transistor 36 and a load line. FIG. 4C shows an exemplary characteristic of the control voltage (BP, BN) vs. the drain power current Id of the power current controlling MOS transistor 36. The power current controlling MOS transistor 36 receives the control voltage (BP, BN) at the gate thereof, so as to increase or decrease the drain power current Id according to the size of the control voltage (BP, BN), as shown in FIG. 4A. As the load line in FIG. 4B shows, when the control voltage (BP, BN) is small, the power current controlling MOS transistor 36 is set to operate in a constant power current region (saturated region: Vds>(Vgs−Vth)), and when the control voltage (BP, BN) is large, the power current controlling MOS transistor 36 is set to operate in a linear region (Vds<(Vgs−Vth)). That is, when outputting a small amount of drain power current Id, the power current controlling MOS transistor 36 operates in a constant power current region (saturated region), and when outputting a large amount of drain power current Id, the power current controlling MOS transistor 36 operates in a linear region.

Accordingly, as shown in FIG. 4C, the power current controlling MOS transistor 36 increases or decreases the drain Id with respect to the control voltage (BP, BN) at a constant change rate, in a constant power current region (saturated region). As opposed to this, the power current controlling MOS transistor 36 increases or decreases the drain Id with respect to the control voltage (BP, BN) at a smaller change rate in a linear region than in the constant power current region (saturated region). In this way, the power current controlling MOS transistor 36 has such a characteristic that the change in the drain power current Id with respect to the control voltage (BP, BN) in the saturated region is larger than the change in the drain power current Id with respect to the control voltage (BP, BN) in the linear region.

Figure 5A:
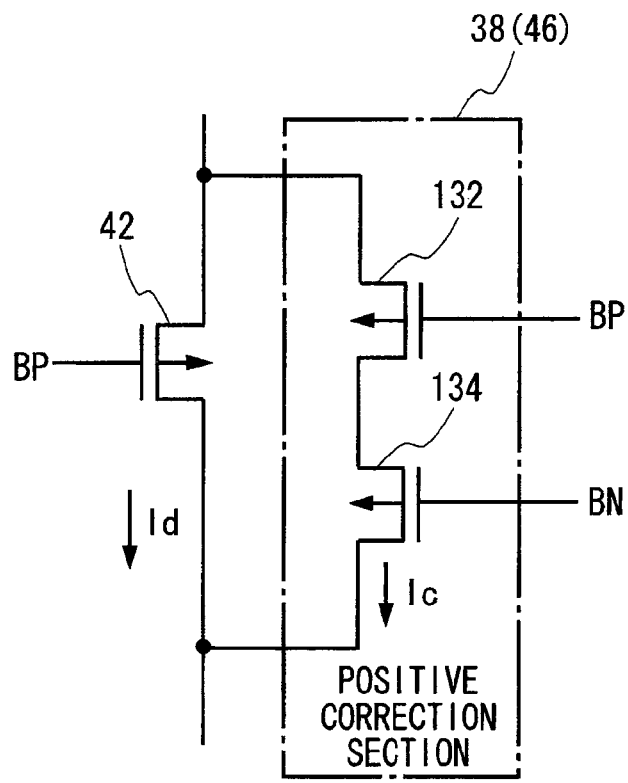
FIG. 5A shows an exemplary configuration of a positive correction section 46 together with a power current controlling pMOS transistor 42.
Figure 5B:
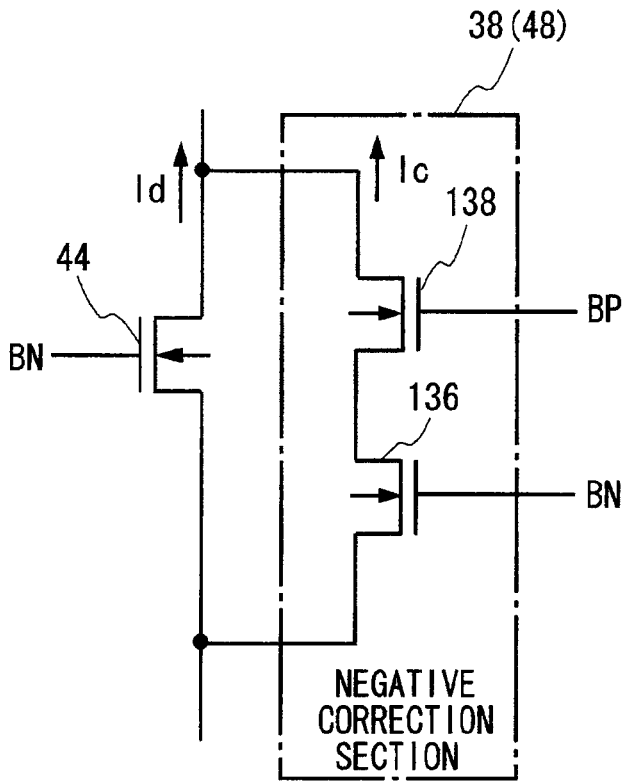
FIG. 5B shows an exemplary configuration of a negative correction section 48 together with a power current controlling nMOS transistor 44.

FIG. 5A shows an exemplary configuration of a positive correction section 46 together with a power current controlling pMOS transistor 42. FIG. 5B shows an exemplary configuration of a negative correction section 48 together with a power current controlling nMOS transistor 44. As shown in FIG. 5A, the positive correction section 46 may include a first correction pMOS transistor 132 and a second correction pMOS transistor 134, which are connected in series with each other in terms of the source/drain, and a positive control voltage BP is inputted to one gate thereof, and a negative control voltage BN is inputted to the other gate thereof In this case, the positive correction section 46 may be such that the first correction pMOS transistor 132 that receives the positive control voltage BP at the gate thereof is connected to the source of the power current controlling pMOS transistor 42, and the second correction pMOS transistor 134 that receives the negative control voltage at the gate thereof is connected to the drain of the power current controlling pMOS transistor 42, and vise versa.

As shown in FIG. 5B, the negative correction section 48 has a first correction nMOS transistor 136 and a second correction nMOS transistor 138, which are connected in series with each other in terms of the source/drain, and a negative control voltage BN is inputted to one gate thereof, and a positive control voltage BP is inputted to the other gate thereof. In this case, the negative correction section 48 may be such that the first correction nMOS transistor 136 that receives the negative control voltage BN at the gate thereof is connected to the source of the power current controlling nMOS transistor 44, and the second correction nMOS transistor 138 that receives the negative control voltage BN at the gate thereof is connected to the drain of the power current controlling nMOS transistor 44, and vice versa.

Figure 6A:
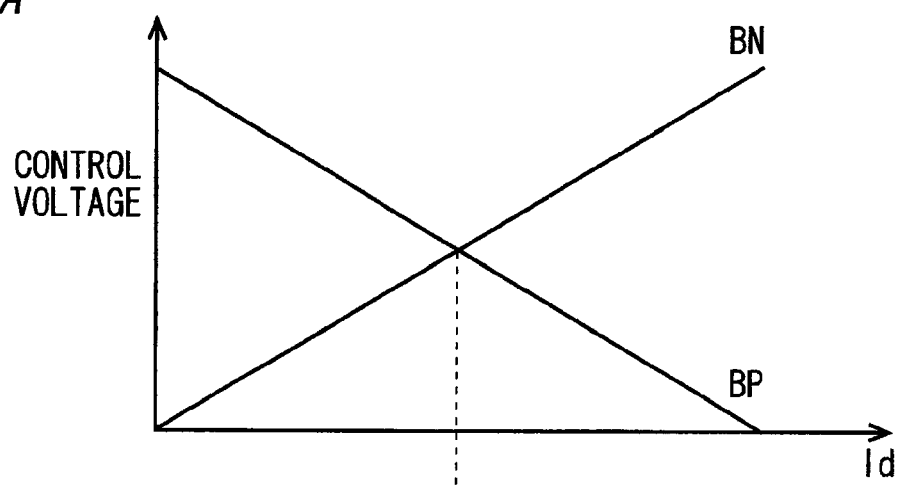
FIG. 6A shows an example of a change of a positive control voltage BP with respect to a drain power current ID, and a change of a negative control voltage BN with respect to a drain power current Id.
Figure 6B:
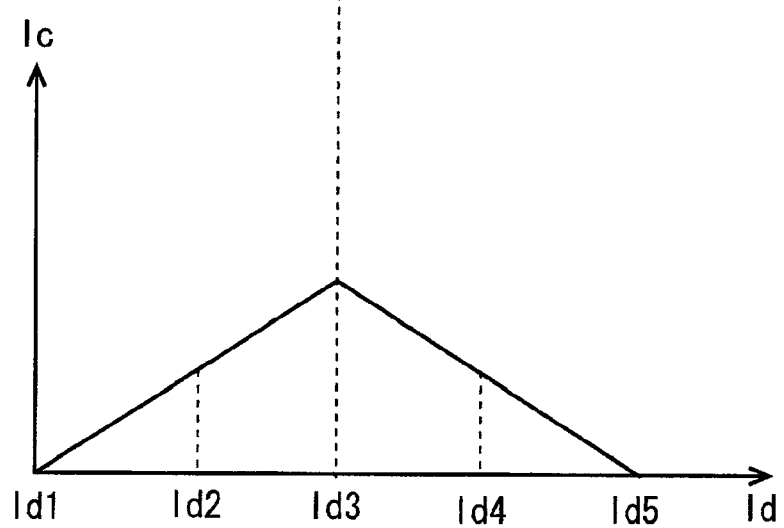
FIG. 6B shows an example of a correction power current Ic run by the positive correction section 46 and the negative correction section 48 shown in FIG. 5.

FIG. 6A shows an example of a change of a positive control voltage BP with respect to a drain power current Id, and a change of a negative control voltage BN with respect to a drain power current Id. FIG. 6B shows an example of a correction power current Ic run by the positive correction section 46 and the negative correction section 48 shown in FIG. 5. As shown in FIG. 6A, the delay controller 34 generates a positive control voltage BP that becomes smaller as the drain power current Id running through the power current controlling pMOS transistor 42 increases, and a negative control voltage BN that becomes larger as the drain power current Id running through the power current controlling nMOS transistor 44 increases.

The positive correction section 46 and the negative correction section 48 shown in FIG. 5, when the drain power current Id is extremely small (e.g., "Id1" in FIG. 6B), do not run a correction power current Ic, because the first correction pMOS transistor 132 and the first correction nMOS transistor 136 are both OFF. As the drain power current Id increases from the extremely small state, the first correction pMOS transistor 132 and the first correction nMOS transistor 136 gradually transition from OFF to ON, and on the contrary, the second correction pMOS transistor 134 and the second correction nMOS transistor 138 gradually transition from ON to OFF.

Accordingly, when the drain power current Id gradually increases from an extremely small state (e.g., "Id2" in FIG. 6B), the positive correction section 46 and the negative correction section 48 gradually increase the correction power current Ic. Next, when the positive control voltage BP and the negative control voltage BN are equal to each other (e.g., "Id3" in FIG. 6B), the positive correction section 46 and the negative correction section 48 output the maximum correction power current Ic. Next, in the state where a drain power current Id is further increased from a state where the positive control voltage BP and the negative control voltage BN are equal to each other (e.g., "Id4" in FIG. 6B), the positive correction section 46 and the negative correction section 48 gradually decrease the correction power current Ic. When the drain power current Id is extremely large (e.g., "Id5" in FIG. 6B), the positive correction section 46 and the negative correction section 48 do not run a correction power current Ic because the second correction pMOS transistor 134 and the second correction nMOS transistor 138 are OFF.

The positive correction section 46 and the negative correction section 48 described above can output a correction power current Ic that decreases monotonically after increasing monotonically, as the drain power current Id increases. Accordingly, the positive correction section 46 and the negative correction section 48 can output a correction power current Ic on a monotonic decrease as the drain power current Id increases, up to a predetermined boundary power current in a normal usage range of the drain power current Id. Note that the positive correction section 46 and the negative correction section 48 may indirectly receive a positive control voltage BP and a negative control voltage BN, via a circuit that converts them into a voltage generating a correction power current Ic on a monotonic decrease as the drain power current Id increases within a predetermined boundary power current in a normal usage range of the drain power current Id.

Figure 7:
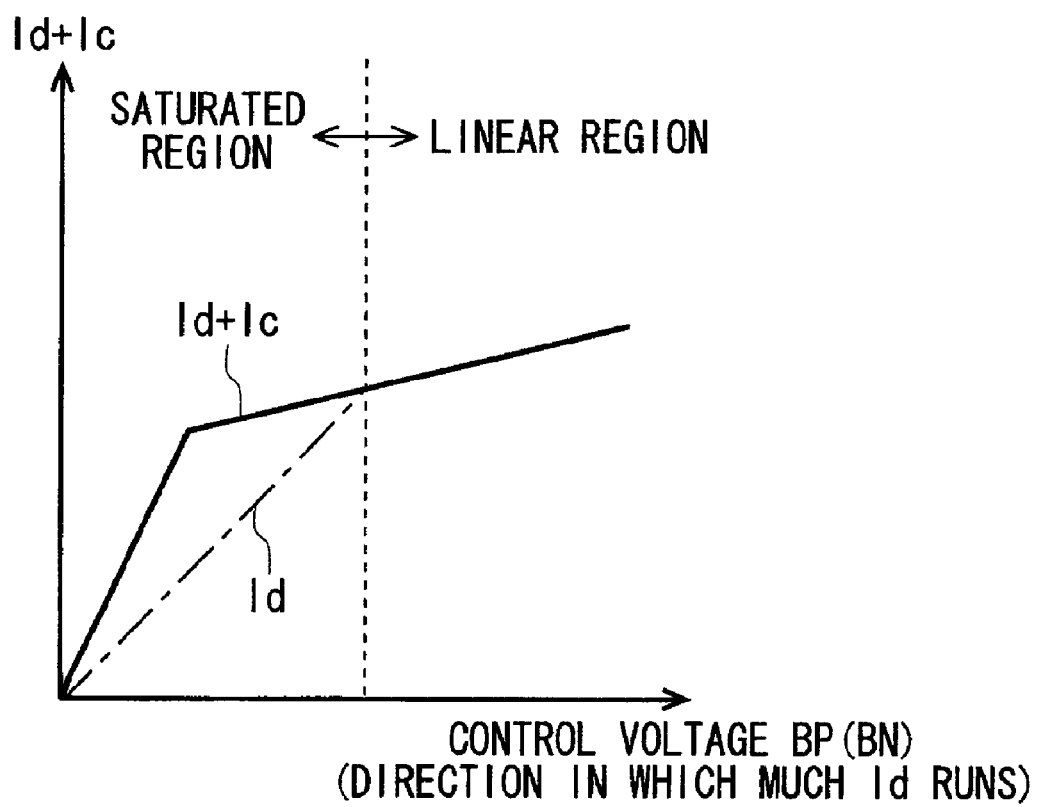
FIG. 7 shows an example of an output power current (Id+Ic) of the delay element 30 with respect to the control voltage BP (BN).

FIG. 7 shows an example of an output power current (Id+Ic) of the delay element 30 with respect to the control voltage BP (BN). The power current controlling MOS transistor 36 outputs a drain power current Id having a smaller change with respect to the control voltage (BP, BN) in a linear region than in a saturated region. The correction section 38 outputs a correction power current Ic on a monotonic decrease as the drain power current Id increases up to a predetermined boundary power current within a normal usage range of the drain power current Id. The delay element 30 runs the output power current (Id+Ic) resulting from adding the correction power current Ic to the drain power current Id, between the delay element 30 and the output terminal 24.

Here, the correction section 38 sets a predetermined boundary power current within the normal usage range of the drain power current Id as a drain power current Id at a substantial boundary between a saturated region and a linear region, for example. The correction section 38 sets a predetermined boundary power current within a range at which the delay element 30 can run a drain power current Id capable of delaying a signal, as a drain power current Id at a substantial boundary between a saturated region and a linear region, for example. Accordingly, the delay element 30 can correct the difference between the change rate of the drain power current Id in a saturated region and the change rate of the drain power current Id in a linear region, by the correction power current Ic. As a result, a portion at which the change rate of the drain power current Id is small can be enlarged.

The correction section 38 may output a correction power current Ic according to which the change of the drain power current Id with respect to the control voltage in the saturated region of the power current controlling MOS transistor 36 within the normal usage range of the drain power current Id linearly approaches the change of the drain power current Id with respect to the control voltage in the linear region of the power current controlling MOS transistor 36 within the normal usage range. Accordingly, as shown in FIG. 7, the delay element 30 is able to bring the change rate of the portion of the saturated region that is near to the linear region to be substantially equal to the change rate in the linear region, and further to output an output power current (Id+Ic) resulting from smoothly connecting the saturated region to the linear region. Accordingly, the delay element 30 can enlarge a portion at which the change rate of the drain power current Id is small.

For example, the positive correction section 46 may output a positive correction power current according to which the change of the positive drain power current with respect to the positive control voltage BP in the saturated region of the power current controlling pMOS transistor 42 within the normal usage range of the positive drain power current linearly approaches the change of the positive drain power current with respect to the positive control voltage BP in the linear region of the power current controlling pMOS transistor 42 within the normal usage range. In addition, the negative correction section 48 may output a negative correction power current according to which the change of the negative drain power current with respect to the negative control voltage BN in the saturated region of the power current controlling nMOS transistor 44 within the normal usage range of the negative drain power current linearly approaches the change of the negative drain power current with respect to the negative control voltage BN in the linear region of the power current controlling nMOS transistor 44 in the normal usage range.

Figure 8A:
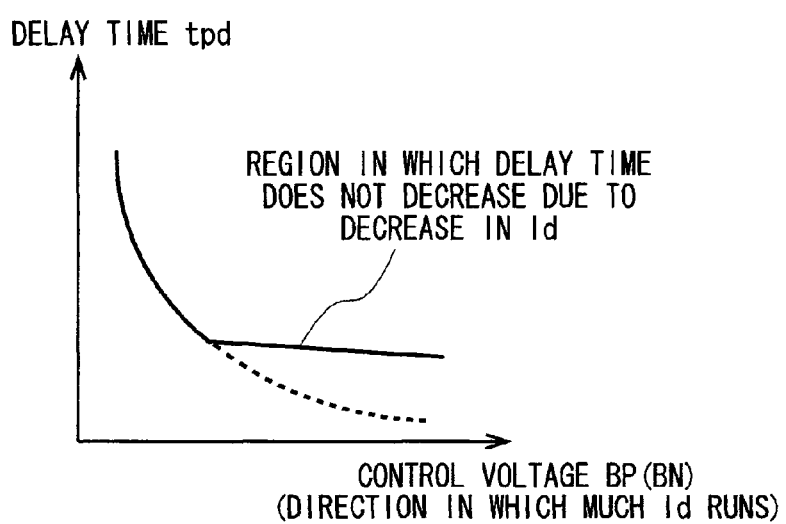
FIG. 8A shows an exemplary change of the delay time tpd with respect to the control voltage (BP, BN) when the variable delay circuit 20 does not include a correction section 38.
Figure 8B:
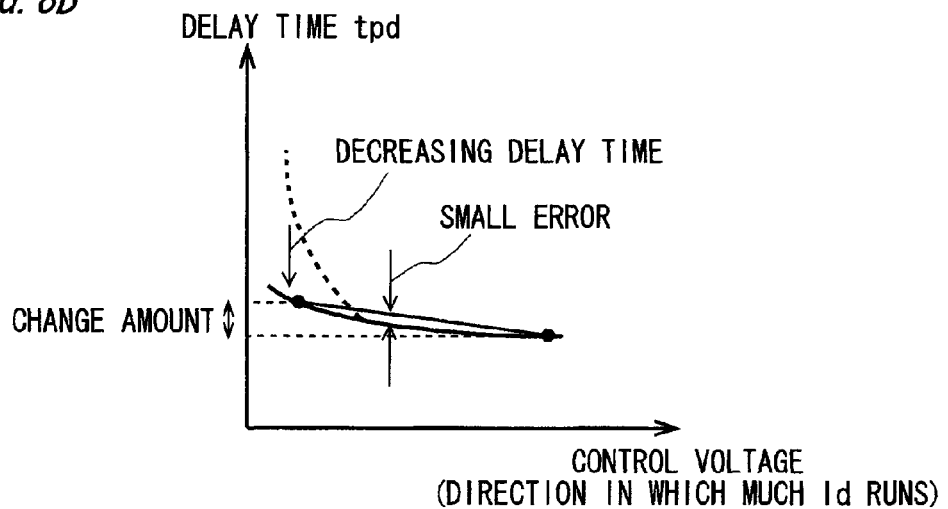
FIG. 8B shows an exemplary change of the delay time tpd with respect to the control voltage (BP, BN) in the variable delay circuit 20 according to the present embodiment.

FIG. 8A shows an exemplary change of the delay time tpd with respect to the control voltage (BP, BN) when the variable delay circuit 20 does not include a correction section 38. FIG. 8B shows an exemplary change of the delay time tpd with respect to the control voltage (BP, BN) in the variable delay circuit 20 according to the present embodiment.

The delay time tpd of an output signal is inversely proportional to the power current running through the capacitor 32. Accordingly, the variable delay circuit 20 not including the correction section 38 is able to control the delay time tpd with respect to the control voltage as a hyperbolic pattern, if the power current controlling MOS transistor 36 is operated in the saturated region (constant power current region). However, when the gate voltage Vgs is increased by decreasing the voltage Vds between the source and the drain, in the variable delay circuit 20 not including the correction section 38, the power current controlling MOS transistor 36 operates in the linear region within the range where the control voltage is large (i.e., within the region where the drain power current Id is large), and so the outputted drain power current Id is smaller in quantity than when operated in the saturated region. Accordingly, a variable delay circuit 20 not including a correction section 38 has to have a larger delay time tpd than in an ideal hyperbolic line in the region where the control voltage is large, as shown in FIG. 8A.

As opposed to this, the variable delay circuit 20 according to the present embodiment is able to decrease the delay time tpd in the region where the control voltage is small (i.e., in the region where the drain power current Id is small), since the correction power current Ic is added to the drain power current Id, as shown in FIG. 8B. For example, the variable delay circuit 20 of the present embodiment outputs a correction power current Ic so that the change of the drain power current Id with respect to the control voltage in the saturated region linearly approaches the change of the drain power current Id with respect to the control voltage in the linear region. In this way, according to the variable delay circuit 20, the delay time can be linearly changed in a wider range from a large control voltage to a small control voltage.

Figure 9:
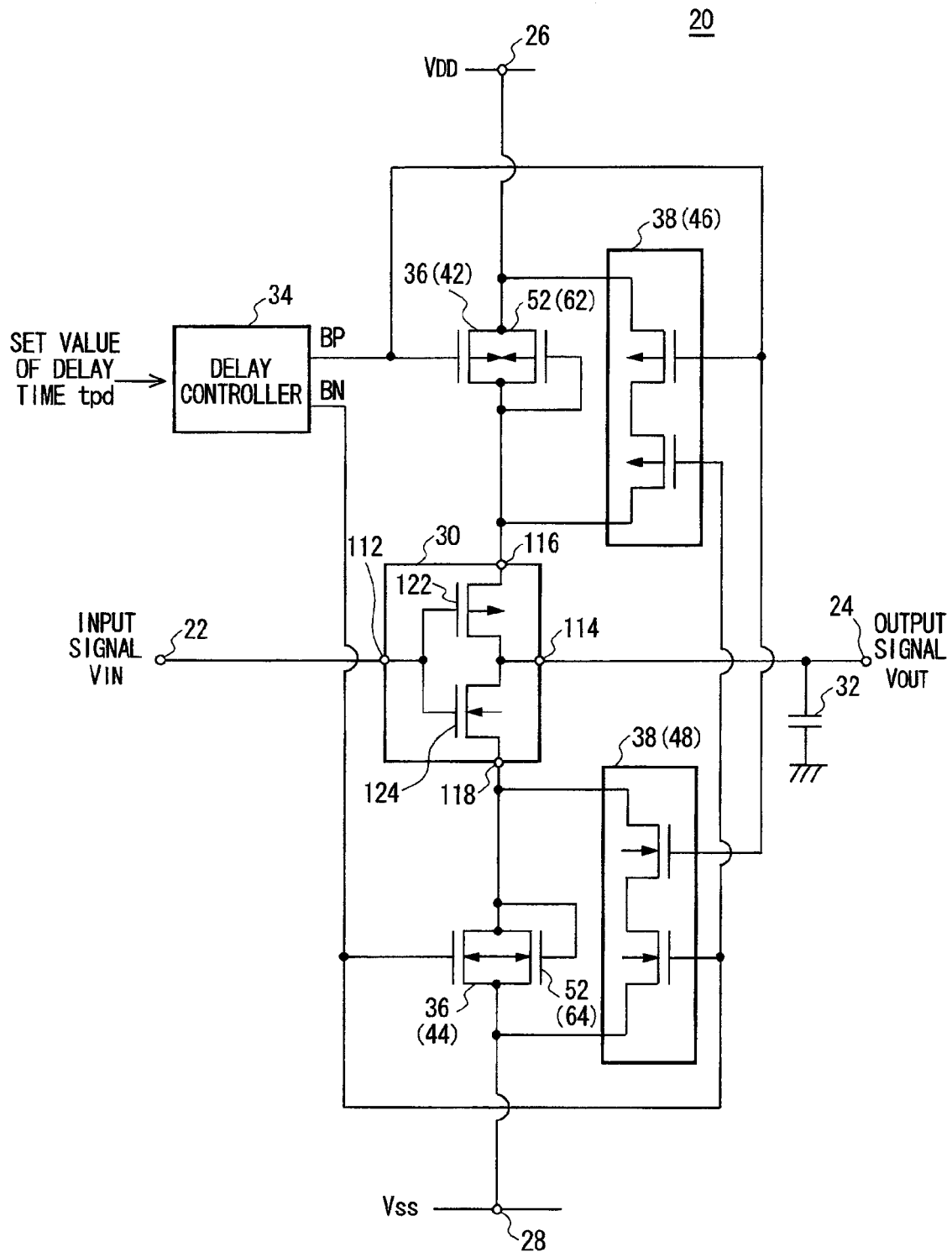
FIG. 9 shows a configuration of the variable delay circuit 20 according to a first modification example of the present embodiment.

FIG. 9 shows a configuration of the variable delay circuit 20 according to a first modification example of the present embodiment. The variable delay circuit 20 according to the present modification example adopts the same configuration and function as the member assigned the identical reference numeral in FIG. 2, and so only the differences are explained below. The variable delay circuit 20 according to the present modification example further includes an additional MOS transistor 52. The additional MOS transistor 52 is a diode connection type because of being connected in parallel to the source and the drain of the power current controlling MOS transistor 36, and having a gate connected to the drain of the power current controlling MOS transistor 36. The additional MOS transistor 52 may be an additional pMOS transistor 62 of a diode connection type being connected in parallel to the source and the drain of the power current controlling pMOS transistor 42 and having a gate connected to the drain of the power current controlling pMOS transistor 42, and an additional nMOS transistor 64 of a diode connection type being connected in parallel to the source and the drain of the power current controlling nMOS transistor 44 and having a gate connected to the drain of the power current controlling nMOS transistor 44, for example.

Figure 10:
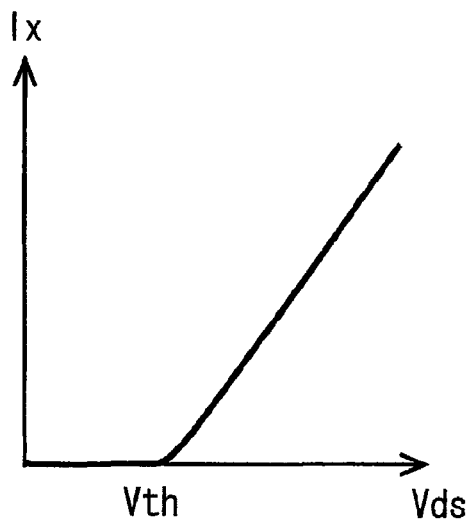
FIG. 10 shows a characteristic of a voltage Vds between the source and the drain vs. the power current Ix, in an additional MOS transistor 52.

FIG. 10 shows a characteristic of a voltage Vds between the source and the drain vs. the power current Ix, in an additional MOS transistor 52 according to the first modification example. The additional MOS transistor 52 does not run a power current Ix between the source and the drain when the voltage Vds between the source and the drain is a threshold value voltage (Vth) or below. The additional MOS transistor 52 runs a power current Ix that is proportional to the voltage Vds between the source and the drain when the voltage Vds between the source and the drain is larger than the threshold value voltage (Vth). In this way, the additional MOS transistor 52 has the same characteristic as a diode.

Figure 11:
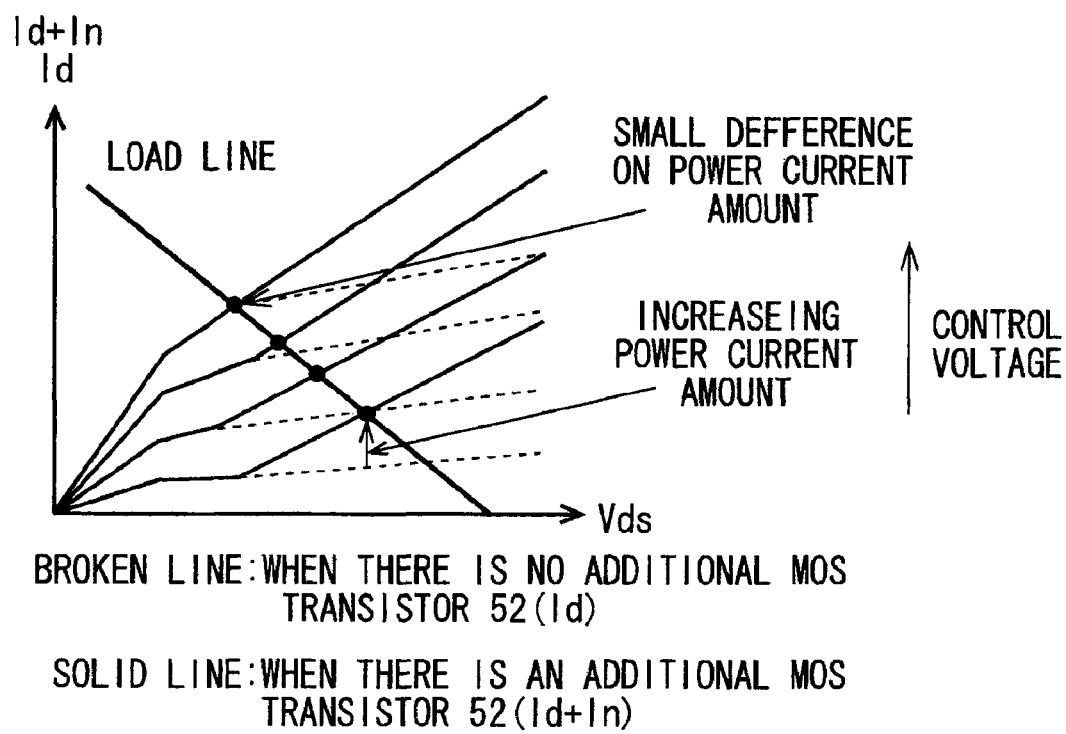
FIG. 11 shows an example of a characteristic of a voltage Vds between the source and the drain vs. a power current (Id+Ix) and a load line, in a composite circuit in a power current controlling MOS transistor 36 and an additional MOS transistor 52 according to the first modification example.

FIG. 11 shows an example of a characteristic and a load line of a voltage Vds between the source and the drain vs. a power current (Id+Ix), in a composite circuit in a power current controlling MOS transistor 36 and an additional MOS transistor 52 according to the first modification example. A composite circuit provided with an additional MOS transistor 52 in parallel to the power current controlling MOS transistor 36 has a larger power current (Id+Ix) as the voltage Vds between the source and the drain increases when the voltage Vs between the source and the drain is a threshold value voltage (Vth) or above, than when a composite circuit not provided with an additional MOS transistor 52. When the control voltage is large (i.e., when the power current (Id+Ix) is large), the composite circuit outputs a power current having a smaller difference from the drain power current Id of the power current controlling MOS transistor 36, and when the control voltage is small (i.e., when the power current (Id+Ix) is small), the composite circuit outputs a power current having a larger difference from the drain power current Id of the power current controlling MOS transistor 36. That is, the variable delay circuit 20 according to the present modification example outputs an output power current having a larger increase rate in a region where the control voltage is small.

Figure 12:
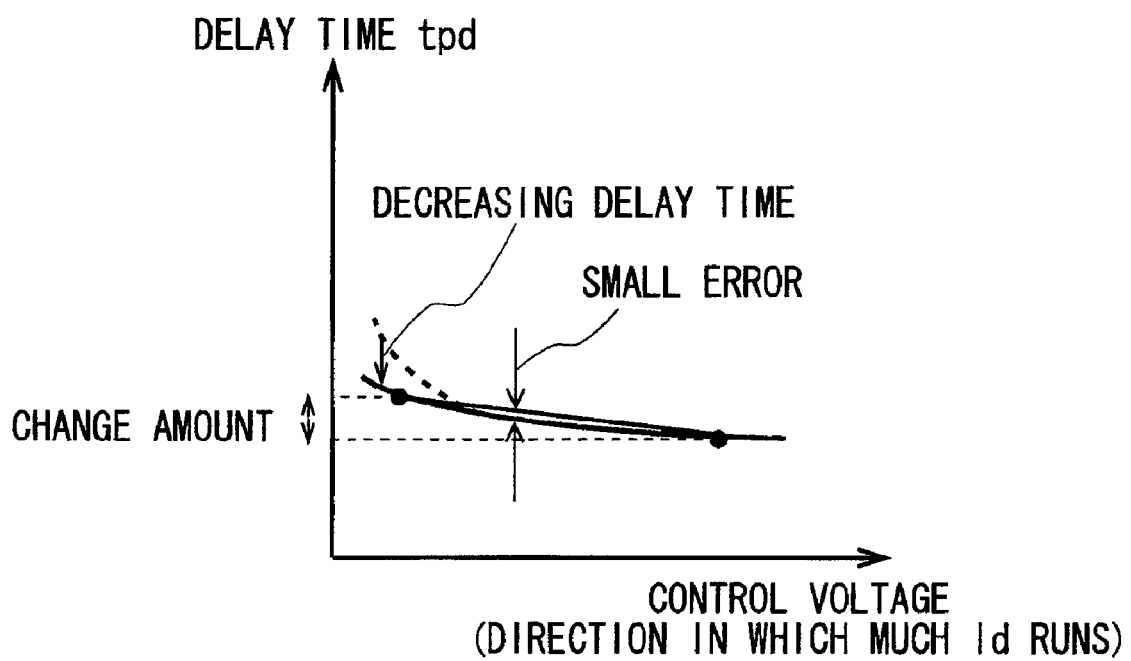
FIG. 12 shows an exemplary delay time tpd with respect to the control voltage BP in the variable delay circuit 20 according to the first modification example of the present embodiment.

FIG. 12 shows an exemplary change in delay time tpd with respect to the control voltage BP in the variable delay circuit 20 according to the first modification example. According to the variable delay circuit 20 of the present modification example, the output power current increases due to the effect of the additional MOS transistor 52 in a region where the control voltage is small, and so the delay time decreases in a region where the control voltage is small. According to the variable delay circuit 20 of the present modification example, the gradient of the delay time with respect to the control voltage in a region where the control voltage is small can be nearer to the gradient of the delay time with respect to the control voltage in a region where the control voltage is large. Consequently, the delay time can be changed linearly in a wider range of the control voltage.

Figure 13:
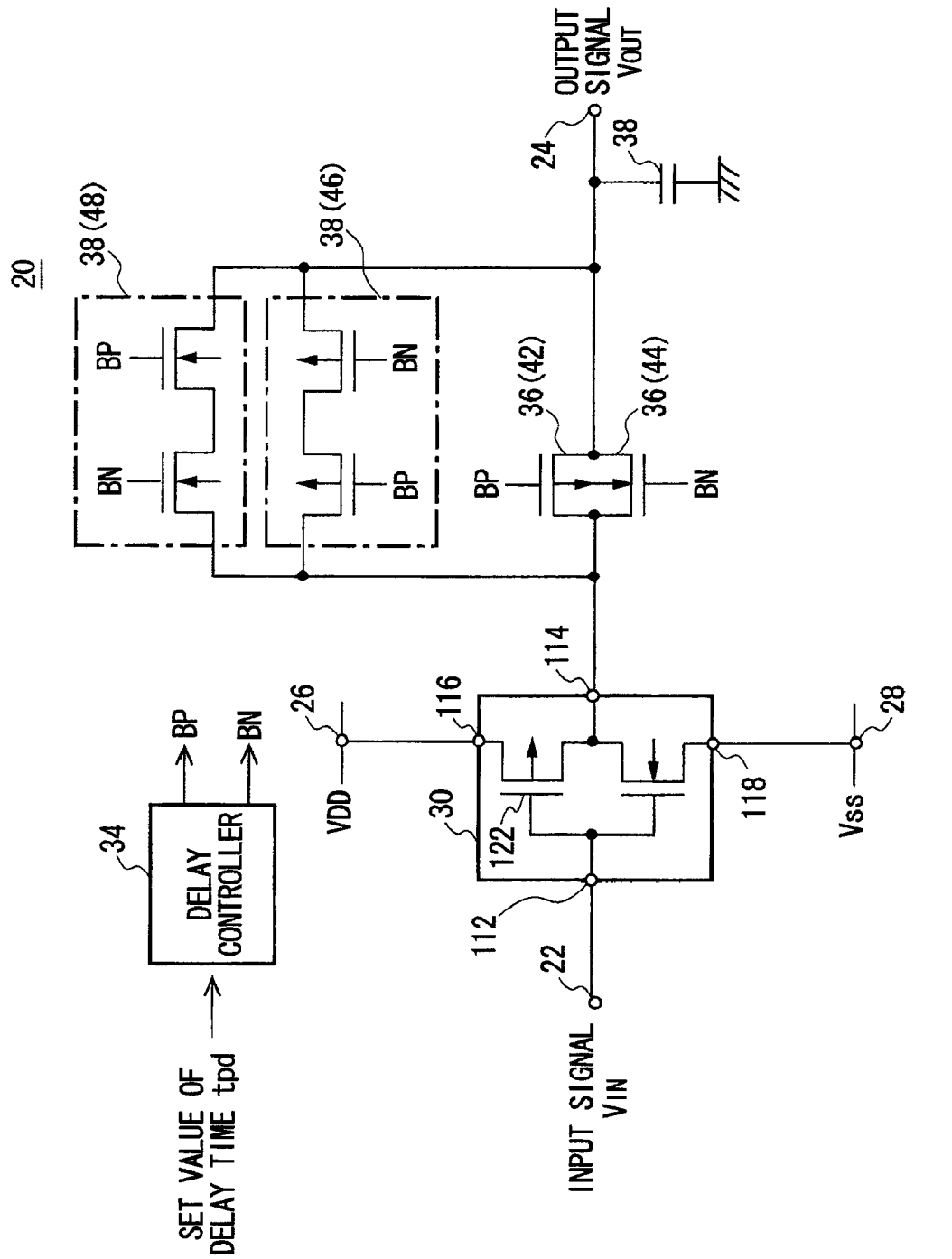
FIG. 13 shows a configuration of a variable delay circuit 20 according to a second modification example of the present embodiment.

FIG. 13 shows a configuration of a variable delay circuit 20 according to a second modification example of the present embodiment. The variable delay circuit 20 according to the present modification example adopts the same configuration and function as the member assigned the identical reference numeral in FIG. 2, and so only the differences are explained below. In the power current controlling MOS transistor 36 of the present modification example, the source and the drain thereof are connected between the delay element output terminal 114 of the delay element 30 and the output terminal 24 of the variable delay circuit 20. In the similar manner, the correction section 38 is connected between the delay element output terminal 114 and the output terminal 24. As an example, each of the power current controlling pMOS transistor 42 and the power current controlling nMOS transistor 44 may be such that the source and the drain thereof are connected between the delay element output terminal 114 of the delay element 30 and the output terminal 24 of the variable delay circuit 20. Also as an example, each of the positive correction section 46 and the negative correction section 48 may be connected between the delay element output terminal 114 and the output terminal 24. The variable delay circuit 20 according to the second modification example explained above outputs an output power current resulting from adding the correction power current Ic to the drain power current Id, just as in the case of the circuit shown in FIG. 2. Consequently, the delay time can be changed linearly in a wider range of the control voltage.

Figure 14:
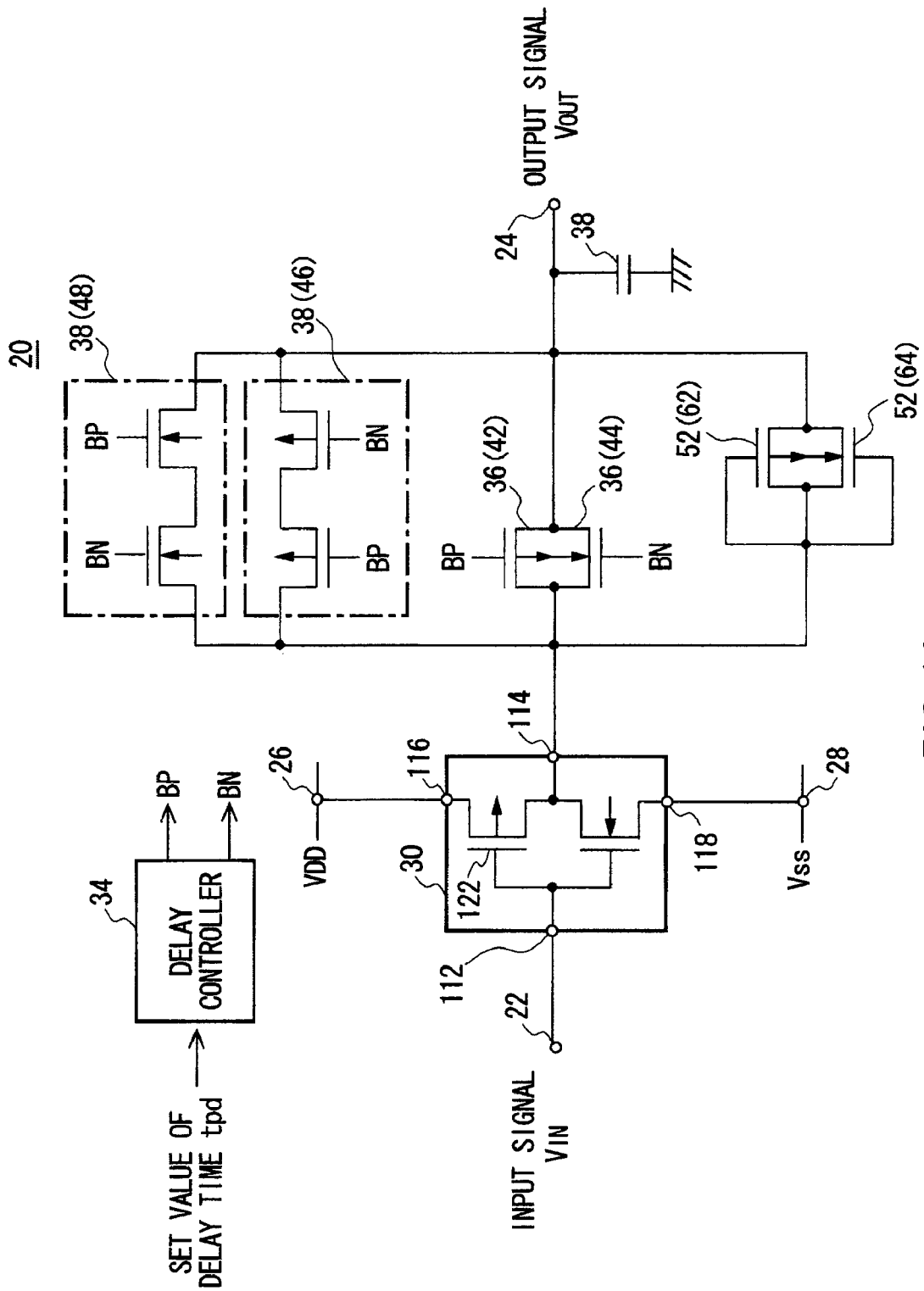
FIG. 14 shows a configuration of a variable delay circuit 20 according to a third modification example of the present embodiment.

FIG. 14 shows a configuration of a variable delay circuit 20 according to a third modification example of the present embodiment. The variable delay circuit 20 according to the present modification example adopts the same configuration and function as the member assigned the identical reference numeral in FIG. 13, and so only the differences are explained below. The variable delay circuit 20 according to the present modification example further includes an additional MOS transistor 52. The additional MOS transistor 52 is a diode connection type because of being connected in parallel to the source and the drain of the power current controlling MOS transistor 36, and having a gate connected to the drain of the delay controller 34. The additional MOS transistor 52 may be an additional pMOS transistor 62 of a diode connection type being connected in parallel to the source and the drain of the power current controlling pMOS transistor 42 and having a gate connected to the source of the power current controlling pMOS transistor 42, and an additional nMOS transistor 64 of a diode connection type being connected in parallel to the source and the drain of the power current controlling nMOS transistor 44 and having a gate connected to the source of the power current controlling nMOS transistor 44, for example.

According to the variable delay circuit 20 according to the third modification example explained above, the gradient of the delay time with respect to the control voltage in a region where the control voltage is small can be nearer to the gradient of the delay time with respect to the control voltage in a region where the control voltage is large compared to the circuit shown in FIG. 13. Consequently, the delay time can be changed linearly in a wider range of the control voltage.

In addition, the test apparatus 10 may be a test circuit provided on an electronic device on which a circuit under test is also provided. The test circuit is realized as a BIST circuit of an electronic device for example, and tests the circuit under test for diagnosis of the electronic device, and the like. Accordingly, the test circuit is able to check whether a circuit under test can perform the operation that the electronic device should perform.

In addition, the test apparatus 10 may be a test circuit provided in a board or an apparatus on which a circuit under test is also provided. Such a test circuit can also check whether a circuit under test is able to perform the operation that the circuit under test should perform.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like in the apparatus, the system, the program, and the method described in the claims, the specification, and the drawings are not necessarily performed in the described order. The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

What is claimed is:

1. A variable delay circuit that outputs an output signal delayed with respect to an input signal by a designated delay time, comprising:

a delay controller that outputs a control voltage according to a set value of the delay time;

a power current controlling MOS transistor that receives the control voltage at a gate thereof, and outputs a drain power current according to the control voltage;

a correction section that is connected in parallel to a source and a drain of the power current controlling MOS transistor, and outputs a correction power current on a monotonic decrease as the drain power current increases in a range larger than a predetermined boundary power current within a normal usage range of the drain power current; and a delay element that runs an output power current resulting from adding the correction power current to the drain power current, between the delay element and an output terminal of the variable delay circuit, and outputs the output signal delayed by a time according to the output power current, when changing a signal value of the output signal according to the input signal.

2. The variable delay circuit according to claim 1, wherein the delay controller outputs a positive control voltage that is higher when a set value of the delay time is larger, and a negative control voltage that is lower when the set value of the delay time is larger, wherein the variable delay circuit comprises:

a power current controlling pMOS transistor being the power current controlling MOS transistor that receives the positive control voltage at a gate thereof and outputs a positive drain power current according to the positive control voltage;

a power current controlling nMOS transistor being the power current controlling MOS transistor that receives the negative control voltage at a gate thereof, and outputs a negative drain power current according to the negative control voltage;

a positive correction section being the correction section that is connected in parallel to a source and a drain of the power current controlling pMOS transistor and outputs a positive correction power current on a monotonic decrease as the drain power current increases in a range larger than the boundary power current within a normal usage range of the positive drain power current; and a negative correction section being the correction section that is connected in parallel to a source and a drain of the power current controlling nMOS transistor and outputs a negative correction power current on a monotonic decrease as the drain power current increases in a range larger than the boundary power current within a normal usage range of the negative drain power current, and wherein in causing a signal value of the output signal to rise according to the input signal, the delay element outputs, from the output terminal of the variable delay circuit, a positive output power current resulting from adding the correction power current to the positive drain power current, thereby outputting a rising edge of the output signal delayed by a time according to the positive output power current, and in causing a signal value of the output signal to fall according to the input signal, the delay element runs, in the output terminal of the variable delay circuit, a negative output power current resulting from adding the correction power current to the negative drain power current, thereby outputting a falling edge of the output signal delayed by a time according to the negative output power current.

3. The variable delay circuit according to claim 2, wherein
the source of the power current controlling pMOS transistor connects to a positive power supply terminal,
the drain of the power current controlling pMOS transistor connects to a positive power supply input terminal of the delay element,
the source of the power current controlling nMOS transistor connects to a negative power supply terminal, and
the drain of the power current controlling nMOS transistor connects to a negative power supply input terminal of the delay element.

4. The variable delay circuit according to claim 2, wherein
each of the power current controlling pMOS transistor and the power current controlling nMOS transistor is such that the source and the drain thereof are connected between an output terminal of the delay element and an output terminal of the variable delay circuit.

5. The variable delay circuit according to claim 2, further comprising:
an additional pMOS transistor of a diode connection type that is connected in parallel to the source and the drain of the power current controlling pMOS transistor, and that has a gate connected to the drain of the power current controlling pMOS transistor; and
an additional nMOS transistor diode connection type that is connected in parallel to the source and the drain of the power current controlling nMOS transistor, and that has a gate connected to the drain of the power current controlling nMOS transistor.

6. The variable delay circuit according to claim 2, wherein
the positive correction section includes two pMOS transistors,
the two pMOS transistors are connected in series with each other in terms of source/drain, one gate receiving the positive control voltage, and the other gate receiving the negative control voltage, and
the two pMOS transistors connected in series with each other are connected in parallel to the power current controlling pMOS transistor.

7. The variable delay circuit according to claim 2, wherein
the negative correction section includes two nMOS transistors,
the two nMOS transistors are connected in series with each other in terms of source/drain, one gate receiving the negative control voltage, and the other gate receiving the positive control voltage, and
the two nMOS transistors connected in series with each other are connected in parallel to the power current controlling nMOS transistor.

8. A test apparatus for testing an electronic device, the test apparatus comprising:
a pattern generator that generates a test pattern for testing the electronic device;
a waveform shaper that shapes the test pattern and supplies the shaped test pattern to the electronic device; and
a timing generator that outputs a timing signal for controlling a timing at which the waveform shaper supplies the test pattern to the electronic device, wherein
the timing generator includes:
a delay controller that outputs a control voltage according to a designated value of a delay time designated by the test pattern to delay a reference clock;
a power current controlling MOS transistor that receives the control voltage at a gate thereof, and outputs a drain power current according to the control voltage;
a correction section that is connected in parallel to a source and a drain of the power current controlling MOS transistor and outputs a correction power current, the correction power current increasing monotonically as the drain power current increases in a range smaller than a predetermined boundary power current within a normal usage range of the drain power current, and decreasing monotonically as the drain power current increases in a range larger than the boundary power current; and
a delay element that runs, between the delay element and an output terminal of the timing generator, an output power current resulting from adding the correction power current to the drain power current, thereby outputting the timing signal delayed with respect to the reference clock by a time according to the output power current, in changing a signal value of an output signal according to an input signal.

9. An electronic device comprising:
a circuit under test; and
a test circuit for testing the circuit under test, wherein
the test circuit includes:
a pattern generator that generates a test pattern for testing the circuit under test;
a waveform shaper that shapes the test pattern and supplies the shaped test pattern to the circuit under test; and
a timing generator that outputs a timing signal for controlling a timing at which the waveform shaper supplies the test pattern to the circuit under test, and wherein
the timing generator includes:
a delay controller that outputs a control voltage according to a designated value of a delay time designated by the test pattern to delay a reference clock;
a power current controlling MOS transistor that receives the control voltage at a gate thereof, and outputs a drain power current according to the control voltage;
a correction section that is connected in parallel to a source and a drain of the power current controlling MOS transistor and outputs a correction power current, the correction power current increasing monotonically as the drain power current increases in a range smaller than a predetermined boundary power current within a normal usage range of the drain power current and decreasing monotonically as the drain power current increases in a range larger than the boundary power current; and
a delay element that runs, between the delay element and an output terminal of the timing generator, an output power current resulting from adding the correction power current to the drain power current, thereby outputting the timing signal delayed with respect to the reference clock by a time according to the output power current, in changing a signal value of an output signal according to an input signal.

10. A variable delay circuit for outputting an output signal delayed with respect to an input signal by a designated delay time, comprising:
a delay controller that outputs a control signal according to a set value of the delay time;

a power current controller that is coupled with an output terminal of the delay controller, receives a control signal outputted from the delay controller, and outputs a driving power current based on the control signal;

a correction section that is connected in parallel to the power current controller, is coupled with the output terminal of the delay controller, receives the control signal outputted from the delay controller, and outputs a correction power current on a monotonic decrease as the driving power current increases in a range larger than a predetermined boundary power current within a normal usage range of the driving power current; and a delay element that includes a signal input terminal for receiving the input signal, a power supply input terminal for receiving or outputting the power current, and a signal output terminal for outputting an output signal delayed by a time according to the driving power current and the correction power current.

* * * * *